(12) United States Patent
Guo et al.

(10) Patent No.: US 7,545,834 B1
(45) Date of Patent: Jun. 9, 2009

(54) MULTIPLE CHANNEL SWITCH USING DIFFERENTIAL DE-MUX AMPLIFIER AND DIFFERENTIAL MUX EQUALIZER

(75) Inventors: Zhangqi Guo, San Jose, CA (US); Anna Tam, Sunnyvale, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 751 days.

(21) Appl. No.: 11/306,763

(22) Filed: Jan. 10, 2006

(51) Int. Cl.
*H04J 3/02* (2006.01)
(52) U.S. Cl. .................. 370/535; 330/252; 327/407
(58) Field of Classification Search ......... 370/532–537; 330/252, 304; 327/407, 415
See application file for complete search history.

(56) References Cited

U.S. PATENT DOCUMENTS

| | | | | |
|---|---|---|---|---|
| 4,149,037 A * | 4/1979 | Langan | ......... | 370/532 |
| 4,191,856 A * | 3/1980 | Nagano et al. | ......... | 370/533 |
| 4,695,749 A | 9/1987 | Lam | ......... | 326/43 |
| 4,866,306 A | 9/1989 | Hopta | ......... | 327/199 |
| 4,905,238 A * | 2/1990 | Rinaldis | ......... | 370/537 |
| 5,289,048 A * | 2/1994 | Ishihara et al. | ......... | 327/407 |
| 5,808,487 A | 9/1998 | Roy | ......... | 327/55 |
| 6,104,236 A | 8/2000 | Tsinker | ......... | 327/557 |
| 6,137,340 A * | 10/2000 | Goodell et al. | ......... | 327/407 |
| 6,275,435 B1 | 8/2001 | Su et al. | ......... | 365/207 |
| 6,366,320 B1 | 4/2002 | Nair et al. | ......... | 348/300 |
| 6,489,845 B1 * | 12/2002 | Maschhoff | ......... | 330/147 |
| 6,779,007 B1 | 8/2004 | Chen | ......... | 708/209 |
| 6,911,855 B2 | 6/2005 | Yin et al. | ......... | 327/210 |
| 7,026,865 B2 * | 4/2006 | Arguelles | ......... | 330/2 |
| 2003/0185250 A1* | 10/2003 | Harberts et al. | ......... | 370/535 |
| 2004/0125678 A1 | 7/2004 | Sinha et al. | ......... | 365/207 |
| 2005/0195032 A1 | 9/2005 | Wang et al. | ......... | 330/253 |

* cited by examiner

*Primary Examiner*—Min Jung
(74) *Attorney, Agent, or Firm*—Stuart T. Auvinen; gPatent LLC

(57) ABSTRACT

A switch fabric that carries analog differential signals is constructed from 2×2 switches. Each 2×2 switch has two differential inputs that are applied to two demultiplexers. Each 2×2 switch also has two differential outputs, each driven by an equalizing mux. Each demultiplexer has two amplifiers that drive intermediate differential signals to the two equalizing muxes. Each equalizing mux has two equalizers that receive the intermediate differential signals from the two demultiplexers. A select signal enables one equalizer but disables the other to select one of the two intermediate differential inputs. A combining amplifier receives differential outputs from both equalizers and generates a final differential output. R, C values in each equalizer can be adjusted to compensate for loading variations in the intermediate differential signals which can have different physical lengths in a switch fabric.

20 Claims, 7 Drawing Sheets

| DEMUX12 ENABLES | | MUX21 SELECTS | | FUNCTION | |
|---|---|---|---|---|---|
| S1A | S1B | S2A | S2B | | |
| 0 | 0 | 0 | 1 | A-->A | B-->B |
| 0 | 0 | 1 | 0 | B-->A | A-->B |
| 0 | 1 | 0 | 0 | A-->A | A-->B |
| 1 | 0 | 1 | 1 | B-->A | B-->B |

FIG. 1B

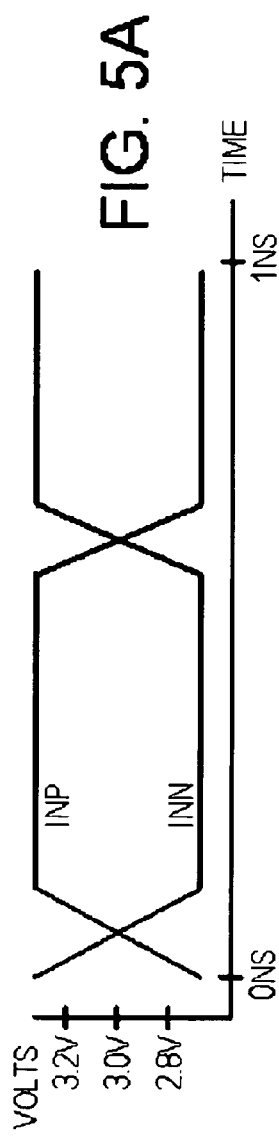
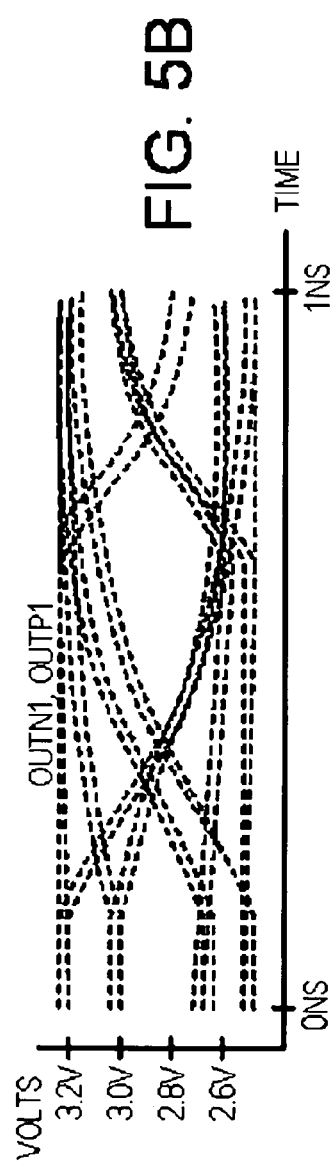
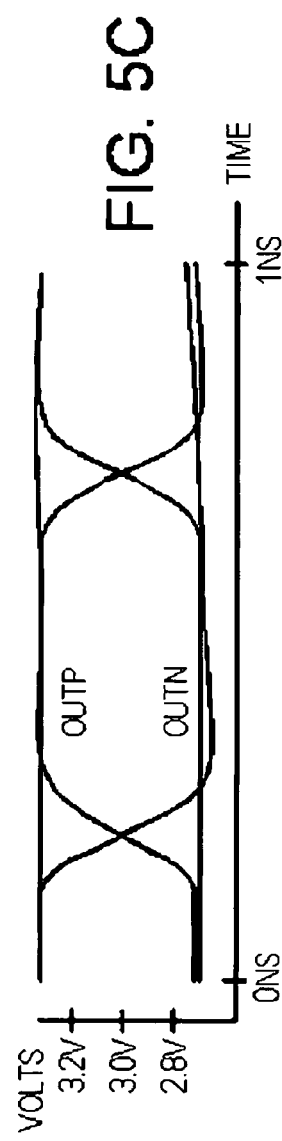

MULTIPLE CHANNEL SWITCH USING DIFFERENTIAL DE-MUX AMPLIFIER AND DIFFERENTIAL MUX EQUALIZER

FIELD OF THE INVENTION

This invention relates to analog switches, and more particularly to a multiplexer and de-multiplexer for analog signals with equalization.

BACKGROUND OF THE INVENTION

Switches have been used for communications and network applications. A switch fabric that forms interconnections may be constructed from a variety of devices, such as pass transistors, gates, store-and-forward nodes, etc. However, these are typically digital devices that pass digital signals.

More recently, analog signals have been employed for higher-speed signaling. Differential analog signals allow a small voltage change to be used for signaling, while digital signals require a much larger voltage swing and thus require more energy to charge and discharge capacitances. The smaller voltage changes needed by differential analog signals often allows for faster signaling than digital signals.

Analog signals are significantly degraded when passing through a switch fabric. The impedance of transistors in a switch fabric may be small enough for slower digital signals, but for faster analog signals the impedance is too large, causing signal degradation at high frequencies.

The lengths and loads of various paths through a switch fabric may vary, causing mis-matched loads and variable delays on differential signals. Without the large noise margin of digital signals, analog signals can be ruined by such variable path loading. Thus either digital signals are used in switch fabrics, or larger-swing analog signals are used. Analog signals such as low-voltage differential signaling (LVDS) may only swing by a few hundred millivolts and are sensitive to such path mis-matches.

What is desired is a switch fabric for switching small-swing analog signals. A multiplexer and demultiplexer for analog signals is desirable that can be used as a building block in a larger switch fabric. A mux/demux that cancels loading effects and regenerates analog signals is desirable.

BRIEF DESCRIPTION OF THE DRAWINGS

FIG. 1B is a logic table of the 2×2 switch of FIG. 1A.

FIGS. 5A-C are plots of transient simulations of input and output signals for 2×2 switch 16.

DETAILED DESCRIPTION

The present invention relates to an improvement in differential analog switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
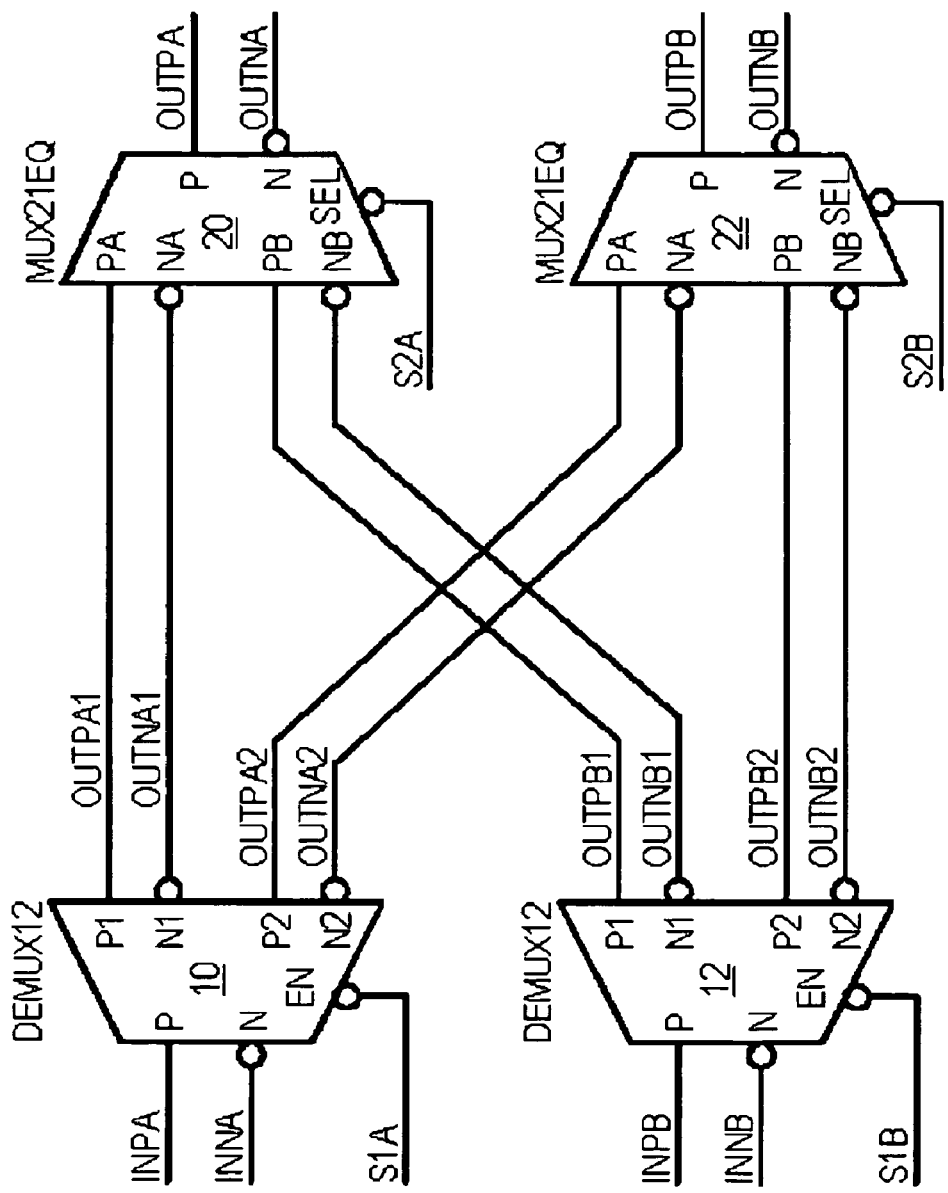
FIG. 1A is a block diagram of a 2×2 switch matrix.

FIG. 1A is a block diagram of a 2×2 switch matrix. A larger switch fabric may be constructed by an extension and modification of 2×2 switch 16, such as having three 1:3 demuxes and three 3:1 muxes for a 3×3 switch.

Demux 10 receives a differential input, positive (true) input A (INPA) and negative (complement) input A (INNA), that move in opposite directions as logical states change. Enable signal S1A is applied to the enable input of demux 10. When enable signal S1A is low, demux 10 amplifies the voltage difference on its P, N inputs and drives both outputs P1, N1 and P2, N2. When enable signal S1A is high, the outputs are disabled and driven low.

Demux 12 receives a second (B) differential input INPB and INNB, and a different enable signal S1B. When enable signal S1B is low, demux 12 amplifies the voltage difference on its P, N inputs and drives both outputs P1, N1 and P2, N2. When enable signal S1B is high, the outputs are disabled and driven low.

An equalizing multiplexer, equalizing mux 20, receives two differential inputs, PA, NA and PB, NB, and selects one of these differential inputs as the differential output P, N. Select signal S2A is applied as the select input SEL. When S2A is low, differential input A (PA, NA) is selected, while when S2A is high, differential input B (PB, NB) is selected as switch output A (OUTPA, OUTNA).

Another equalizing multiplexer, equalizing mux 22, also receives two differential inputs, PA, NA and PB, NB, and selects one of these differential inputs as the differential output P, N. Select signal S2B is applied as the select input SEL. When S2B is low, differential input A (PA, NA) is selected, while when S2B is high, differential input B (PB, NB) is selected as switch output B (OUTPB, OUTNB).

The selected differential input is equalized to compensate for loading effects or mismatches on the differential signals from demux 10, 12. Intermediate signals between demux 10,12 and equalizing mux 20, 22 may have different physical lengths and capacitive and resistive loads due to physical layout variations.

For example, intermediate differential signals OUTPA1, OUTNA1 between demux 10 and equalizing mux 20 may have shorter paths than intermediate differential signals OUTPB1, OUTNB1 between demux 12 and equalizing mux 20. Likewise, intermediate differential signals OUTPB2, OUTNB2 between demux 12 and equalizing mux 22 may have shorter paths than intermediate differential signals OUTPA2, OUTNA2 between demux 10 and equalizing mux 22.

FIG. 1B is a logic table of the 2×2 switch of FIG. 1A. Four control signals determine the switching of the A and B switch inputs to the A and B switch outputs. Enables S1A, S1B are low to enable driving the outputs of demux 10, 12. When S1A is high, as in the fourth row of the table, input A cannot be sent to either switch output, so both A and B switch outputs receive the remaining enabled input B, or B→A for the A output (OUTPA, OUTNA) from equalizing mux 20, and B→B for the B output (OUTPB, OUTNB) from equalizing mux 22.

Likewise, when S1B is high, as in the third row of the table, input B cannot be sent to either switch output, so both A and B switch outputs receive the remaining enabled input A, or A→A for the A output (OUTPA, OUTNA) from equalizing mux 20, and A→B for the B output (OUTPB, OUTNB) from equalizing mux 22.

The select inputs to equalizing mux 20, 22 must also be set correctly. For example, when S2A is high, as in the fourth row of the table, S2A is high to cause equalizing mux 20 to select its bottom (second) input from demux 12 (which amplifies the B switch input) and S2B is high to cause equalizing mux 22 to select its bottom (second) input from demux 12 (which amplifies the B switch input).

In the third row of the table, S2A is low, causing equalizing mux 20 to select its first (top) input, so that output A gets input A (A→A). S2B is also low, causing equalizing mux 22 to select its first (top) input, so that output B also gets input A (A→B).

In the first row of the table, S2A is low, causing equalizing mux 20 to select its first (top) input, so that output A gets input A (A→A). S2B is high, causing equalizing mux 22 to select its second (lower) input, so that output B gets input B (B→B).

In the second row of the table, S2A is high, causing equalizing mux 20 to select its second (lower) input, so that output A gets input B (B→A). S2B is low, causing equalizing mux 22 to select its first (top) input, so that output B gets input A (A→B).

Figure 2:
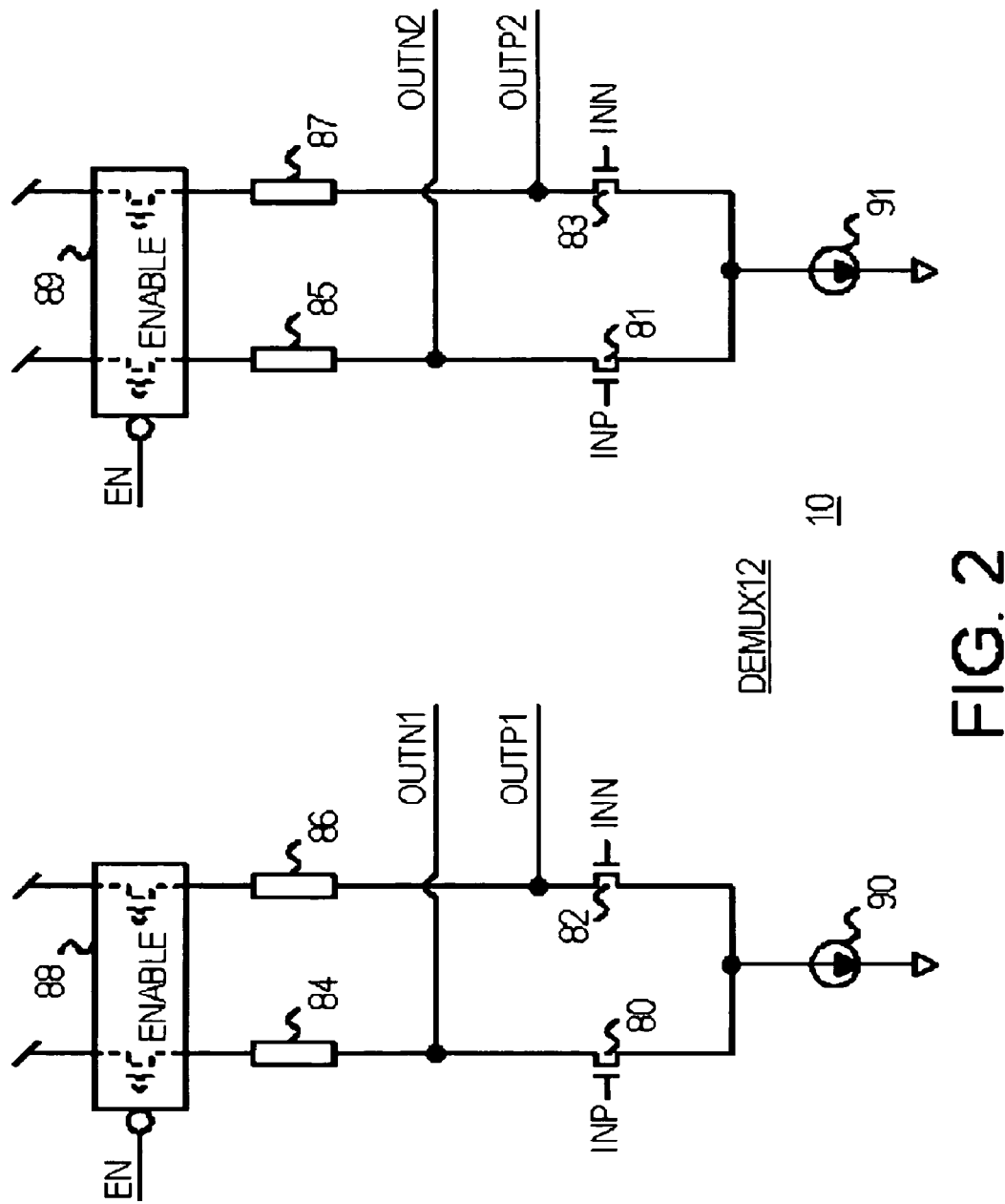
FIG. 2 is a schematic of an amplifying de-multiplexer for an analog switch.

FIG. 2 is a schematic of an amplifying de-multiplexer for an analog switch. Demux 10 has one differential input, INP, INN, and two differential outputs OUTP1, OUTN1, and OUTP2, OUTN2.

When enable input EN is low, enabling source block 88 is turned on, allowing current from the power supply to flow through loads 84, 86 to first output nodes OUTP1, OUTN1. Differential inputs INP, INN are applied to the gates of n-channel differential transistors 80, 82, respectively, which have their source tied together and drains connected to first output nodes OUTN1, OUTP1, respectively. Current sink 90 sinks current from the sources of differential transistors 80, 82 to ground. The voltage difference between differential inputs INP, INN is amplified by differential transistors 80, 82 to generate the first differential output on first output nodes OUTP1, OUTN1 when enabling source block 88 is turned on.

When enable input EN is low, enabling source block 89 is also turned on, allowing current from the power supply to flow through loads 85, 87 to second output nodes OUTP2, OUTN2. Differential inputs INP, INN are also applied to the gates of n-channel differential transistors 81, 83, respectively, which have their source tied together and drains connected to second output nodes OUTN2, OUTP2, respectively. Current sink 91 sinks current from the sources of differential transistors 81, 83 to ground. The voltage difference between differential inputs INP, INN is amplified by differential transistors 81, 83 to generate the second differential output on second output nodes OUTP2, OUTN2 when enabling source block 89 is turned on.

When enable input EN is high, enabling source blocks 88, 89 are turned off, and first output nodes OUTP1, OUTN1 and second output nodes OUTP2, OUTN2 are driven low.

Figure 3A:
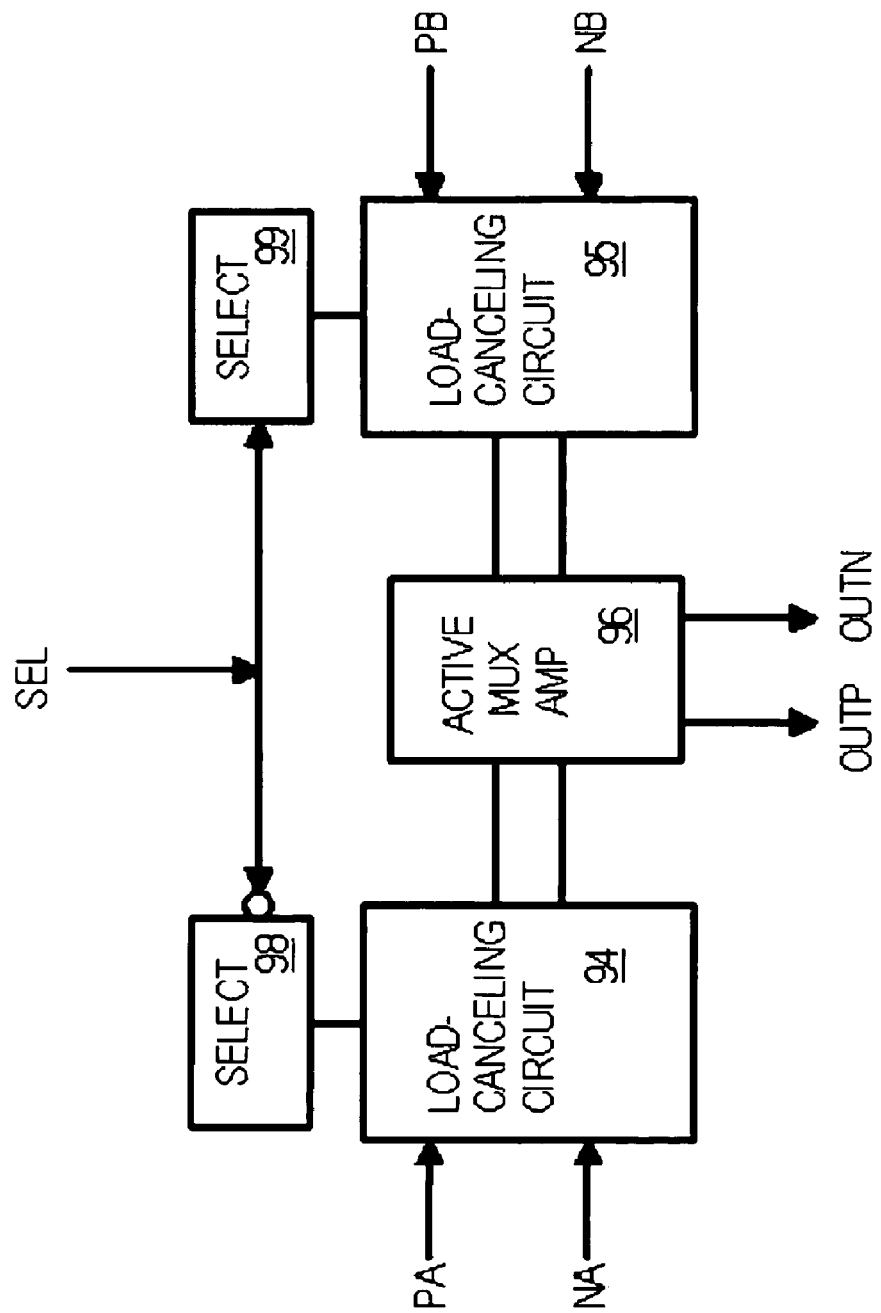
FIG. 3A is a block diagram of an equalizing multiplexer for an analog switch.

FIG. 3A is a block diagram of an equalizing multiplexer for an analog switch. Two differential inputs are received, A input PA, NA, which is applied to load-canceling circuit 94, and B input PB, NB, which is applied to load-canceling circuit 95.

Select input SEL is applied to enabling source block 99 and inverted and applied to enabling source block 98. One of enabling source blocks 98, 99 is turned on while the other is turned off. Enabling source block 98 turns on load-canceling circuit 94 when SEL is low, while enabling source block 99 turns on load-canceling circuit 95 when SEL is high.

Active mux amplifier 96 receives the equalized differential signal from whichever one of load-canceling circuit 94, 95 is turned on by its enabling source block 98, 99. The enabled equalized differential signal is thus selected from the two differential inputs by the SEL signal and enabling source blocks 98, 99. Active mux amplifier 96 amplifies the enabled differential signal and generates switch differential output OUTP, OUTN. Active mux amplifier 96 can be a 2:1 amplifier in one embodiment.

Figure 3B:
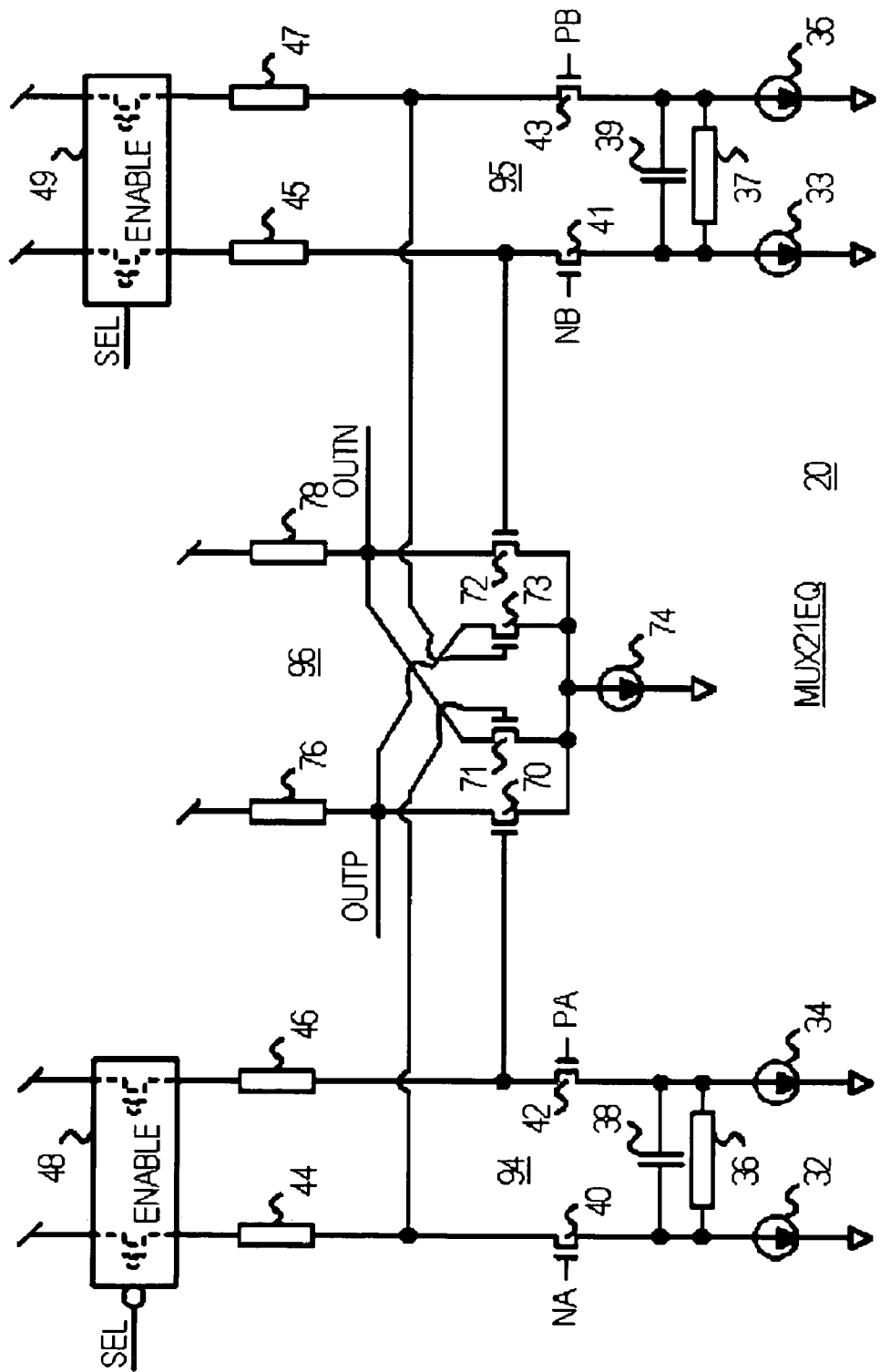
FIG. 3B is a schematic of an equalizing multiplexer for an analog switch.

FIG. 3B is a schematic of an equalizing multiplexer for an analog switch. Select input SEL when low turns on enabling source block 48 and turns off enabling source block 49 to select the A input PA, NA. SEL being high turns off enabling source block 48 and turns on enabling source block 49 to select the B input PB, NB.

When SEL is low, enabling source block 48 turns on, delivering current through loads 44, 46 to the drains of differential n-channel transistors 40, 42, which receive NA, PA on their gates. The drains of differential n-channel transistors 40, 42 are intermediate signals sent to amplifier 96 which generates switch output OUTP, OUTN of equalizing mux 20.

Current sink 32 draws current from the source of differential n-channel transistor 40, while current sink 34 draws current from the source of differential n-channel transistor 42. Capacitor 38 and resistor 36 are connected in parallel between the sources of differential n-channel transistors 40, 42 and act as a filter. At high frequency, capacitor 38 effectively shorts the sources together. The R and C values of capacitor 38 and resistor 36 can be adjusted to compensate for high-frequency signal loss that occurs on differential input A (PA, NA) in the switch. For example, a chip designer can choose R,C values that best compensate for actual loadings on the lines of differential input A.

When SEL is high, enabling source block 49 turns on, delivering current through loads 45, 47 to the drains of differential n-channel transistors 41, 43, which receive B inputs NB, PB, respectively, on their gates. The drains of differential n-channel transistors 41, 43 are intermediate signals sent to amplifier 96 which generates switch output OUTP, OUTN.

Current sink 33 draws current from the source of differential n-channel transistor 41, while current sink 35 draws current from the source of differential n-channel transistor 43. Capacitor 39 and resistor 37 are connected in parallel between the sources of differential n-channel transistors 41, 43 and act as a filter.

The R and C values of capacitor 39 and resistor 37 can be adjusted to compensate for high-frequency signal loss that occurs on differential input B (PB, NB) in the switch. Since the actual loads on differential inputs A and B can be different, different C values can be chosen for capacitors 38, 39, and resistors 36, 37 can likewise have different values. Thus signal loss that varies with line loading can be compensated for by individually adjusting R and C values in each of load-canceling circuits 94, 95 (FIG. 3A).

The drains of differential n-channel transistors 40, 42, which are an intermediate equalized signal generated from input A to the amplifier, are applied to the gates of differential n-channel amplifier transistors 70, 71 in amplifier 96. The drains of differential n-channel transistors 41, 43, which are an intermediate equalized signal generated from input B, are applied to the gates of differential n-channel amplifier transistors 72, 73 in amplifier 96.

Since one of load-canceling circuits 94, 95 is turned off and the other is turned on, the intermediate equalized signal from the turned-off equalizer are driven low, causing their differential amplifier transistors to be turned off. The enabled load-canceling circuit drives its intermediate equalized signal to the gates of two of differential n-channel amplifier transistors 70, 71, 72, 73, which amplify the voltage difference. The source of all four differential n-channel amplifier transistors 70, 71, 72, 73 are connected together and to current sink 74 to ground.

The drains of differential n-channel amplifier transistors 70, 73 are connected together at switch output node OUTP, which receives current from the power supply through load 76. The drains of differential n-channel amplifier transistors 71, 72 are connected together at switch output node OUTN, which receives current from the power supply through load 78.

Figure 4:
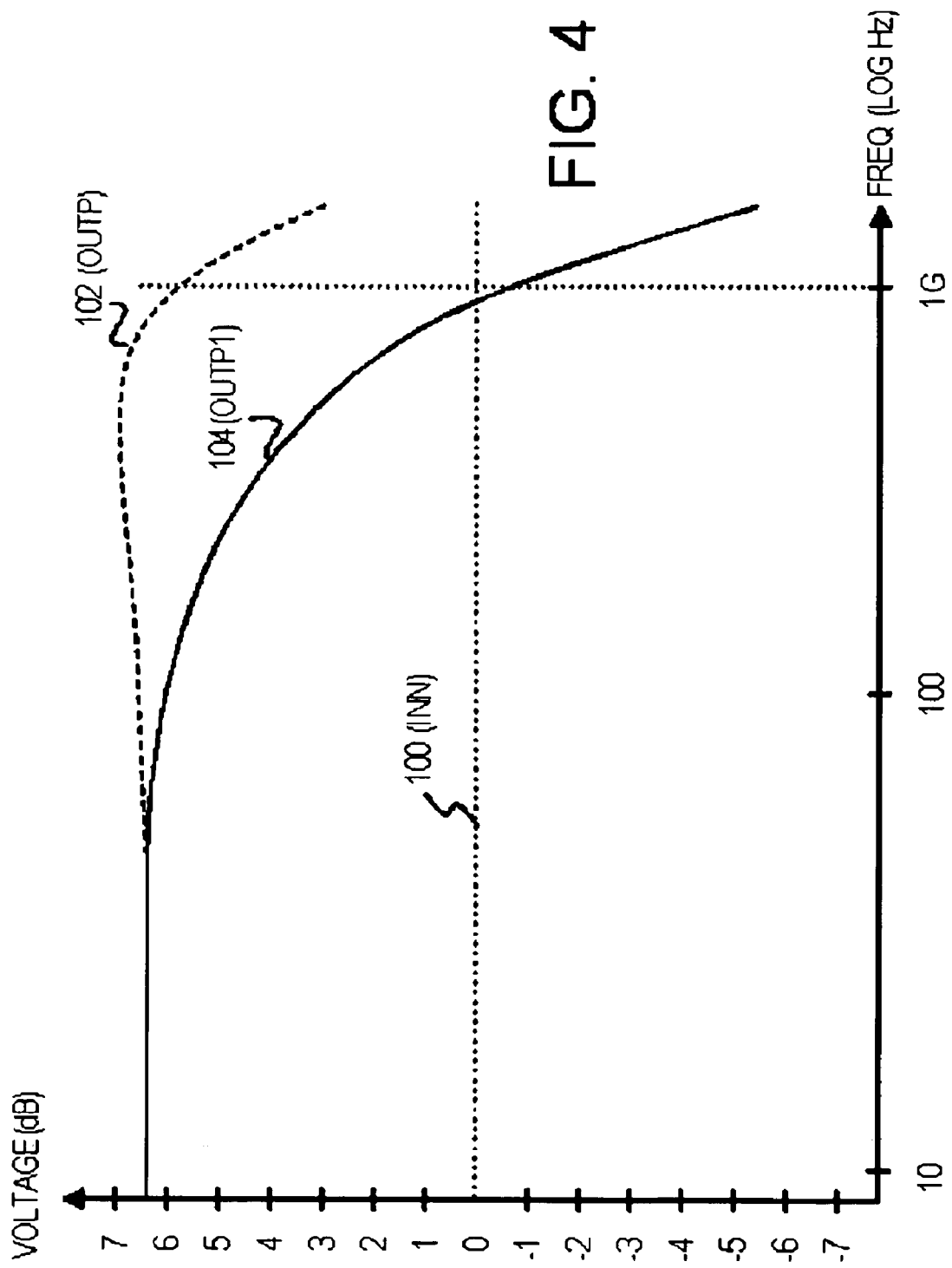
FIG. 4 is a graph of a simulation of signal loss as a function of frequency.

FIG. 4 is a graph of a simulation of signal loss as a function of frequency. The differential input, INN, receives a 1 volt A.C. signal, and is shown as flat curve 100. The intermediate differential output of the demux is OUTP1, curve 104, which is before the equalizer in equalizing mux 20. Equalizing by equalizing mux 20 boosts the signal strength of the switch output, OUTP, as seen in curve 102.

As seen in curves 102, 104, signal loss occurs at higher frequency, such as near 1 GHz. Signal OUTP1 loss is about 7 dB at 1 GHZ when the loading capacitance is 0.4 pF. Thus signal OUTP loss is significantly reduced by equalization in equalizing mux 20.

FIGS. 5A-C are eye-pattern plots of transient simulations of input and output signals for 2×2 switch 16. FIG. 5A shows differential inputs INP, INN switching at 2 Gb/s pseudo-random binary sequence (PRBS) data. FIG. 5B shows intermediate outputs OUTP1, OUTN1. Jitter is significant, as seen by the spreading of the signal traces in FIG. 5B. However, in FIG. 5C, the final switch outputs OUTP, OUTN, have greatly reduced jitter. Jitter is reduced from more than 100 ps in FIG. 5B to less than 10 ps in FIG. 5C. The ideal bandwidth of a multiple channel switch is flat during both high frequency and low frequency.

ALTERNATE EMBODIMENTS

Several other embodiments are contemplated by the inventors. For example p-channel differential transistors could be used rather than n-channel, and current sinks could be converted to current sources from power rather than from ground, and enabling source blocks could connect to ground, and the circuits generally flipped over.

Loads, such as loads 84, 85, 86, 87 in FIG. 2, may be resistor loads or transistors loads such as transistors with a fixed gate bias voltage applied. Enabling source blocks 88, 89, 48, 49 may be p-channel transistors with enable input EN applied to the gates. Current sinks 90, 91, 32-25 may be n-channel transistors with a bias voltage applied to the gates. Other embodiments are also possible for these and other components.

Additional components may be added, such as additional circuits, transistors, resistors, capacitors, etc. Rather than have a single enable or select, multiple signals may be combined by logic functions such as OR's. Inversions and buffering may be added. The demultiplexers and equalizing muxes in a switch do not have to located next to each other but could be separated by other switches or circuitry in the switch fabric. The R, C values may be adjusted by the designer or even by automated software to compensate for the separation distances. R, C components can be emulated by MOS transistors.

All rows or columns may not have the same number of 2×2 switches. For example, rows on the left of an array may have more switches than rows in the middle or on the right of the array. The 2×2 switches may be arrayed or arranged into a variety of interconnected networks, such as Benes networks, Batcher networks, Clos networks, etc. The 2×2 switches could be arrayed with other kinds of switches in a heterogeneous array. The 2×2 switch 16 could be extended to be a 3×3 switch by extending the demultiplexer to have 3 amplifiers, and be extending equalizing mux 20 to have 3 equalizers and three pairs of differential transistors in active mux amplifier 96. Other basic switch cell sizes are possible, such as 2×1, 3×1, 3×3, 4×4, etc.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An analog differential switch comprising:
a first demultiplexer receiving a first differential input on a first pair of input lines and generating a first intermediate differential signal on a first intermediate pair of lines and generating a second intermediate differential signal on a second intermediate pair of lines;
a second demultiplexer receiving a second differential input on a second pair of input lines and generating a third intermediate differential signal on a third intermediate pair of lines and generating a fourth intermediate differential signal on a fourth intermediate pair of lines;
a first load-canceling circuit, connected to the first intermediate pair of lines, for compensating for loading on the first intermediate pair of lines;
a first select circuit, responsive to a first select signal in a first state, for enabling the first load-canceling circuit;
a second load-canceling circuit, connected to the second intermediate pair of lines, for compensating for loading on the second intermediate pair of lines;
a second select circuit, responsive to a second select signal in a second state, for enabling the second load-canceling circuit;
a third load-canceling circuit, connected to the third intermediate pair of lines, for compensating for loading on the third intermediate pair of lines;
a third select circuit, responsive to the first select signal not in the first state, for enabling the third load-canceling circuit;
a fourth load-canceling circuit, connected to the fourth intermediate pair of lines, for compensating for loading on the fourth intermediate pair of lines;
a fourth select circuit, responsive to the second select signal not in the second state, for enabling the fourth load-canceling circuit;

a first active mux amplifier, coupled to outputs of the first load-canceling circuit and the third load-canceling circuit, for generating a first switch differential output on a first output pair of lines from the first differential input when the first select signal is in the first state, and for generating the first switch differential output from the second differential input when the first select signal is not in the first state; and a second active mux amplifier, coupled to outputs of the second load-canceling circuit and the fourth load-canceling circuit, for generating a second switch differential output on a second output pair of lines from the first differential input when the second select signal is in the second state, and for generating the second switch differential output from the second differential input when the second select signal is not in the second state, whereby differential signals are equalized and multiplexed.

2. The analog differential switch of claim 1 further comprising:

a first enable input to the first demultiplexer, the first enable input disabling the first demultiplexer when the first enable input is in a disable state; and a second enable input to the second demultiplexer, the second enable input disabling the second demultiplexer when the second enable input is in a disable state.

3. The analog differential switch of claim 2 further comprising:

a first filter, in the first load-canceling circuit, having a first filter value adjusted to compensate for physical line loading on the first intermediate pair of lines;

a second filter, in the second load-canceling circuit, having a second filter value adjusted to compensate for physical line loading on the second intermediate pair of lines;

a third filter, in the third load-canceling circuit, having a third filter value adjusted to compensate for physical line loading on the third intermediate pair of lines; and a fourth filter, in the fourth load-canceling circuit, having a fourth filter value adjusted to compensate for physical line loading on the fourth intermediate pair of lines.

4. The analog differential switch of claim 3 wherein the first filter value, the second filter value, the third filter value, and the fourth filter value comprise at least two different filter values.

5. The analog differential switch of claim 4 wherein the first filter value, the second filter value, the third filter value, and the fourth filter value comprise four different filter values.

6. The analog differential switch of claim 3 wherein the first filter, the second filter, the third filter, and the fourth filter each comprise a resistor and a capacitor connected in parallel.

7. The analog differential switch of claim 3 wherein the first load-canceling circuit further comprises:

a first equalizing pair of differential transistors having gates connected to the first intermediate pair of lines, and sources separately connected to a pair of first filter nodes, and have drains separately connected to the first active mux amplifier;

wherein the first filter is connected across the pair of first filter nodes;

wherein the second load-canceling circuit further comprises:

a second equalizing pair of differential transistors having gates connected to the second intermediate pair of lines, and sources separately connected to a pair of second filter nodes, and have drains separately connected to the second active mux amplifier;

wherein the second filter is connected across the pair of second filter nodes;

wherein the third load-canceling circuit further comprises:

a third equalizing pair of differential transistors having gates connected to the third intermediate pair of lines, and sources separately connected to a pair of third filter nodes, and have drains separately connected to the first active mux amplifier;

wherein the third filter is connected across the pair of third filter nodes;

wherein the fourth load-canceling circuit further comprises:

a fourth equalizing pair of differential transistors having gates connected to the fourth intermediate pair of lines, and sources separately connected to a pair of fourth filter nodes, and have drains separately connected to the second active mux amplifier;

wherein the fourth filter is connected across the pair of fourth filter nodes.

8. The analog differential switch of claim 7 wherein the first active mux amplifier further comprises:

a first pair of differential transistors connected by gates to the drains of the first equalizing pair of transistors in the first load-canceling circuit, have sources connected together at a first source node, and have drains connected to the first switch differential output;

a third pair of differential transistors connected by gates to the drains of the third equalizing pair of transistors in the third load-canceling circuit, have sources connected together at the first source node, and have drains connected to the first switch differential output;

wherein the second active mux amplifier further comprises:

a second pair of differential transistors connected by gates to the drains of the second equalizing pair of transistors in the second load-canceling circuit, have sources connected together at a second source node, and have drains connected to the second switch differential output; and a fourth pair of differential transistors connected by gates to the drains of the fourth equalizing pair of transistors in the fourth load-canceling circuit, have sources connected together at the second source node, and have drains connected to the second switch differential output.

9. A switch fabric for switching analog differential signals comprising:

a plurality of interconnected switch cells, each switch cell comprising:

a first differential switch input;

a second differential switch input;

a first demultiplexer that receives the first differential switch input, the first demultiplexer having a first amplifier that amplifies the first differential switch input to generate a first differential intermediate signal and having a first crossover amplifier that amplifies the first differential switch input to generate a first crossover differential intermediate signal;

a second demultiplexer that receives the second differential switch input, the second demultiplexer having a second amplifier that amplifies the second differential switch input to generate a second differential intermediate signal and having a second crossover amplifier that amplifies the second differential switch input to generate a second crossover differential intermediate signal;

a first equalizing multiplexer that has a first equalizer that receives the first differential intermediate signal to generate a first differential equalized signal and a first crossover equalizer that receives the second crossover differential intermediate signal to generate a second crossover differential equalized signal;

a first select circuit, responsive to a first select signal, that disables the first crossover equalizer and enables the first equalizer to generate the first differential equalized signal when the first select signal is in a first state, and that disables the first equalizer and enables the first crossover equalizer to generate the second crossover differential equalized signal when the first select signal is not in the first state;

a first active mux amplifier, in the first equalizing multiplexer, that receives the first differential equalized signal and the second crossover differential intermediate signal and generates a first differential switch output;

a second equalizing multiplexer that has a second equalizer that receives the second differential intermediate signal to generate a second differential equalized signal and a second crossover equalizer that receives the first crossover differential intermediate signal to generate a first crossover differential equalized signal;

a second select circuit, responsive to a second select signal, that disables the second crossover equalizer and enables the second equalizer to generate the second differential equalized signal when the second select signal is in a second state, and that disables the second equalizer and enables the second crossover equalizer to generate the first crossover differential equalized signal when the second select signal is not in the second state; and a second active mux amplifier, in the second equalizing multiplexer, that receives the second differential equalized signal and the first crossover differential intermediate signal and generates a second differential switch output, whereby differential inputs are amplified, equalized, and selected for output.

10. The switch fabric for switching analog differential signals of claim 9 wherein the first differential switch input, the second differential switch input, the first differential intermediate signal, the second differential intermediate signal, the first crossover differential intermediate signal, the second crossover differential intermediate signal, the first differential equalized signal, the second differential equalized signal, the first crossover differential equalized signal, the second crossover differential equalized signal, the first differential switch output, and the second differential switch output each comprise a voltage difference carried on pair of lines, whereby differential signals are each carried on a pair of lines.

11. The switch fabric for switching analog differential signals of claim 9 further comprising:

a first enable signal having a first enable state;
a second enable signal having a second enable state;
a first enable circuit, responsive to the first enable signal, that enables the first demultiplexer to generate the first differential intermediate signal and the first crossover differential intermediate signal when the first enable signal is in the first enable state, and disables the first demultiplexer when the first enable signal is not in the first enable state; and a second enable circuit, responsive to the second enable signal, that enables the second demultiplexer to generate the second differential intermediate signal and the second crossover differential intermediate signal when the second enable signal is in the second enable state, and disables the second demultiplexer when the second enable signal is not in the second enable state.

12. The switch fabric for switching analog differential signals of claim 9 further comprising:

a first filter, in the first equalizer, having a first filter value adjusted to compensate for loading of the first differential intermediate signal;

a first crossover filter, in the first crossover equalizer, having a first crossover filter value adjusted to compensate for loading of the second crossover differential intermediate signal;

a second filter, in the second equalizer, having a second filter value adjusted to compensate for loading of the second differential intermediate signal; and a second crossover filter, in the second crossover equalizer, having a second crossover filter value adjusted to compensate for loading of the first crossover differential intermediate signal, whereby filter values are adjusted to compensate for loading of intermediate signals.

13. The switch fabric for switching analog differential signals of claim 12 wherein the first filter, the first crossover filter, the second filter, and the second crossover filter each comprise a resistor and a capacitor connected in parallel.

14. The switch fabric for switching analog differential signals of claim 12 wherein the first equalizer further comprises:

a first equalizing pair of differential transistors that receives the first differential intermediate signal on gates, have sources separately connected to a pair of first filter nodes, and have drains connected to the first differential equalized signal;

wherein the first filter is connected across the pair of first filter nodes;

wherein the first crossover equalizer further comprises:

a first crossover equalizing pair of differential transistors that receives the second crossover differential intermediate signal on gates, have sources separately connected to a pair of first crossover filter nodes, and have drains connected to the second crossover differential equalized signal;

wherein the first crossover filter is connected across the pair of first crossover filter nodes;

wherein the second equalizer further comprises:

a second equalizing pair of differential transistors that receives the second differential intermediate signal on gates, have sources separately connected to a pair of second filter nodes, and have drains connected to the second differential equalized signal;

wherein the second filter is connected across the pair of second filter nodes;

wherein the second crossover equalizer further comprises:

a second crossover equalizing pair of differential transistors that receives the first crossover differential intermediate signal on gates, have sources separately connected to a pair of second crossover filter nodes, and have drains connected to the first crossover differential equalized signal;

wherein the second crossover filter is connected across the pair of second crossover filter nodes.

15. The switch fabric for switching analog differential signals of claim 14 wherein the first active mux amplifier further comprises:

a first pair of differential transistors that receives the first differential equalized signal on gates, have sources connected together at a first source node, and have drains connected to the first differential switch output;

a first crossover pair of differential transistors that receives the second crossover differential equalized signal on gates, have sources connected together at the first source node, and have drains connected to the first differential switch output;

a first true load and a first complement load connected to true and complement lines of the first differential switch output;

wherein the second active mux amplifier further comprises:

a second pair of differential transistors that receives the second differential equalized signal on gates, have sources connected together at a second source node, and have drains connected to the second differential switch output;

a second crossover pair of differential transistors that receives the first crossover differential equalized signal on gates, have sources connected together at the second source node, and have drains connected to the second differential switch output; and a second true load and a second complement load connected to true and complement lines of the second differential switch output.

16. A load-compensating switch cell comprising:

first dividing amplifier means, receiving a first differential input, for generating a first differential signal on a first intermediate pair and for generating a second differential signal on a second intermediate pair by amplifying the first differential input;

second dividing amplifier means, receiving a second differential input, for generating a third differential signal on a third intermediate pair and for generating a fourth differential signal on a fourth intermediate pair by amplifying the second differential input;

first equalizing means for compensating for loading on the first intermediate pair to generate a first equalized differential signal;

second equalizing means for compensating for loading on the second intermediate pair to generate a second equalized differential signal;

third equalizing means for compensating for loading on the third intermediate pair to generate a third equalized differential signal;

fourth equalizing means for compensating for loading on the fourth intermediate pair to generate a fourth equalized differential signal;

first combining amplifier means, receiving and amplifying the first equalized differential signal when a first select signal is in a first state and receiving the third equalized differential signal when the first select signal is not in the first state, for generating a first switch differential output on a first output pair of lines; and second combining amplifier means, receiving and amplifying the second equalized differential signal when a second select signal is in a second state and receiving the fourth equalized differential signal when the second select signal is not in the second state, for generating a second switch differential output on a second output pair of lines, whereby loading on intermediate pairs is compensated for by equalizers.

17. The load-compensating switch cell of claim 16 wherein the first combining amplifier means further comprises:

a first transistor, having a gate receiving a true differential line carrying the first equalized differential signal, a source connected to a first source node, and a drain connected to a complement differential line of the first output pair of lines;

a second transistor, having a gate receiving a complement differential line carrying the first equalized differential signal, a source connected to the first source node, and a drain connected to a true differential line of the first output pair of lines;

a third transistor, having a gate receiving a true differential line carrying the third equalized differential signal, a source connected to the first source node, and a drain connected to the complement differential line of the first output pair of lines;

a fourth transistor, having a gate receiving a complement differential line carrying the third equalized differential signal, a source connected to the first source node, and a drain connected to the true differential line of the first output pair of lines;

a first load connected to the true differential line of the first output pair of lines;

a second load connected to the complement differential line of the first output pair of lines; and a first current sink coupled to the first source node;

wherein the second combining amplifier means further comprises:

a fifth transistor, having a gate receiving a true differential line carrying the second equalized differential signal, a source connected to a second source node, and a drain connected to a complement differential line of the second output pair of lines;

a sixth transistor, having a gate receiving a complement differential line carrying the second equalized differential signal, a source connected to the second source node, and a drain connected to a true differential line of the second output pair of lines;

a seventh transistor, having a gate receiving a true differential line carrying the fourth equalized differential signal, a source connected to the second source node, and a drain connected to the complement differential line of the second output pair of lines;

an eighth transistor, having a gate receiving a complement differential line carrying the fourth equalized differential signal, a source connected to the second source node, and a drain connected to the true differential line of the second output pair of lines;

a third load connected to the true differential line of the second output pair of lines;

a fourth load connected to the complement differential line of the second output pair of lines; and a second current sink coupled to the second source node.

18. The load-compensating switch cell of claim 17 wherein the first equalizing means comprises:

first true equalizing transistor means for conducting current from a true line carrying the first equalized differential signal to a first true filter node in response to a true line of the first intermediate pair;

first complement equalizing transistor means for conducting current from a complement line carrying the first equalized differential signal to a first complement filter node in response to a complement line of the first intermediate pair;

first filter means, coupled between the first true filter node and the first complement filter node, for filtering the first equalized differential signal;

wherein the second equalizing means comprises:

second true equalizing transistor means for conducting current from a true line carrying the second equalized differential signal to a second true filter node in response to a true line of the second intermediate pair;

second complement equalizing transistor means for conducting current from a complement line carrying the second equalized differential signal to a second complement filter node in response to a complement line of the second intermediate pair;

second filter means, coupled between the second true filter node and the second complement filter node, for filtering the second equalized differential signal;

wherein the third equalizing means comprises:

third true equalizing transistor means for conducting current from a true line carrying the third equalized differential signal to a third true filter node in response to a true line of the third intermediate pair;

third complement equalizing transistor means for conducting current from a complement line carrying the third equalized differential signal to a third complement filter node in response to a complement line of the third intermediate pair;

third filter means, coupled between the third true filter node and the third complement filter node, for filtering the third equalized differential signal;

wherein the fourth equalizing means comprises:

fourth true equalizing transistor means for conducting current from a true line carrying the fourth equalized differential signal to a fourth true filter node in response to a true line of the fourth intermediate pair;

fourth complement equalizing transistor means for conducting current from a complement line carrying the fourth equalized differential signal to a fourth complement filter node in response to a complement line of the fourth intermediate pair; and fourth filter means, coupled between the fourth true filter node and the fourth complement filter node, for filtering the fourth equalized differential signal.

19. The load-compensating switch cell of claim 18 wherein the first filter means comprises a resistor and a capacitor in parallel between the first true filter node and the first complement filter node;

wherein the second filter means comprises a resistor and a capacitor in parallel between the second true filter node and the second complement filter node;

wherein the third filter means comprises a resistor and a capacitor in parallel between the third true filter node and the third complement filter node; and wherein the fourth filter means comprises a resistor and a capacitor in parallel between the fourth true filter node and the fourth complement filter node.

20. The load-compensating switch cell of claim 18 wherein resistance and capacitance values in the first filter means varies from resistance and capacitance values in the second filter means, whereby resistance and capacitance values are adjusted to compensate for physical line loading.

* * * * *